United States Patent
Aoyagi (10) Patent No.: US 7,176,561 B2
(45) Date of Patent: Feb. 13, 2007

(54) SEMICONDUCTOR DEVICE, METHOD FOR MANUFACTURING THE SAME, CIRCUIT BOARD, AND ELECTRONIC EQUIPMENT

(75) Inventor: Akiyoshi Aoyagi, Sagamihara (JP)

(73) Assignee: Seiko Epson Corporation (JP)

( * ) Notice: Subject to any disclaimer, the term of this patent is extended or adjusted under 35 U.S.C. 154(b) by 54 days.

(21) Appl. No.: 11/137,704

(22) Filed: May 25, 2005

(65) Prior Publication Data

US 2005/0263868 A1    Dec. 1, 2005

(30) Foreign Application Priority Data

May 26, 2004    (JP) .............................. 2004-156268

(51) Int. Cl.
 *H01L 23/02*    (2006.01)
 *H01L 21/44*    (2006.01)
(52) U.S. Cl. ..................... 257/686; 257/723; 438/106; 438/109
(58) Field of Classification Search ........ 438/106–109, 438/118; 257/678, 686, 723–725
See application file for complete search history.

(56) References Cited

U.S. PATENT DOCUMENTS 6,388,333 B1    5/2002   Taniguchi et al.
6,583,502 B2 *  6/2003   Lee et al. .................... 257/686
6,781,241 B2    8/2004   Nishimura et al.

FOREIGN PATENT DOCUMENTS

| JP | 06-013541   | 1/1994  |
| JP | 11-8474     | 1/1999  |
| JP | 2001-223297 | 8/2001  |
| JP | 2002-76265  | 3/2002  |
| JP | 2003-318361 | 11/2003 |

OTHER PUBLICATIONS

Communication from Japanese Patent Office regarding corresponding application.

* cited by examiner

*Primary Examiner*—Hsien-Ming Lee
(74) *Attorney, Agent, or Firm*—Harness, Dickey & Pierce, P.L.C.

(57) ABSTRACT

A semiconductor device includes a first package, a second package, a contact part for electrically coupling a first wiring pattern to a second wiring pattern, and a reinforcer. The thermal expansion coefficient of the first package is larger than that of the second package. The second package is disposed so that the second interposer overlaps the first semiconductor chip and the first interposer. The contact part is provided between the first and second interposers so that a first end is coupled to the first wiring pattern and a second end is coupled to the second wiring pattern. The reinforcer is provided to expose part of the contact part and cover the circumference of the first end of the contact part.

13 Claims, 5 Drawing Sheets

SEMICONDUCTOR DEVICE, METHOD FOR MANUFACTURING THE SAME, CIRCUIT BOARD, AND ELECTRONIC EQUIPMENT

RELATED APPLICATIONS

This application claims priority to Japanese Patent Application No. 2004-156268 filed May 26, 2004 which is hereby expressly incorporated by reference herein in its entirety.

BACKGROUND

1. Technical Field

The present invention relates to a semiconductor device, a method for manufacturing the same, a circuit board, and electronic equipment.

2. Related Art

Stacked semiconductor devices have been developed. Since semiconductor chips in the devices are mounted three dimensionally, reducing two-dimensional space required. Furthermore, the device can be formed by combining existing semiconductor chips and thus do not require new design for integrated circuits. However, if each semiconductor chip is supported by an interposer, the bonding strength between upper and lower interposers affects reliability. If any moisture remains in between upper and lower interposers, it can turn into vapor and expand through high-temperature reflow processing, resulting in the separation of the upper and lower interposers.

The present invention aims to improve the bonding strength between upper and lower interposers when each of a plurality of semiconductor chips is supported by an interposer.

SUMMARY

A semiconductor device according to one aspect of the present invention comprises: a first package including a first interposer and a first semiconductor chip, the first interposer having a first wiring pattern, the first semiconductor chip being mounted on the first interposer and being electrically coupled to the first wiring pattern; a second package including a second interposer and a second semiconductor chip, the second interposer having a second wiring pattern, the second semiconductor chip being mounted on the second interposer and being electrically coupled to the second wiring pattern; a contact part electrically coupling the first wiring pattern to the second wiring pattern; and a reinforcer. A thermal expansion coefficient of the first package is larger than a thermal expansion coefficient of the second package. The second package is disposed so that the second interposer overlaps the first semiconductor chip and the first interposer. The contact part is provided between the first and second interposers so that a first end of the contact part is coupled to the first wiring pattern and a second end of the contact part is coupled to the second wiring pattern. The reinforcer is provided to expose a part of the contact part and cover circumference of the first end of the contact part. According to the present invention, the reinforcer covers the first end of the contact part, coupled to the first wiring patter. The first package having the first wiring pattern has a larger thermal expansion coefficient than the second package, and thus the rate of expansion when heated or contraction when cooled is larger. Therefore, larger stress is applied on the first end of the contact part, coupled to the first wiring patter. In the present invention, however, the contact part can be reinforced by the reinforcer effectively. Moreover, since part of the contact part is exposed through the reinforcer, space for releasing vapor and so on is formed between the first and second packages. This configuration can prevent the separation of the first and second packages due to the remaining of vapor and so on, allowing the improvement of bonding strength between the first and second interposes.

The semiconductor device may further comprise a sealing part provided on the second interposer to seal the second semiconductor chip. A thermal expansion coefficient of the first interposer may be larger than a thermal expansion coefficient of the sealing part.

In the semiconductor device, the contact part may include an intermediate part having a largest section, and the reinforcer may be provided to expose the intermediate part of the contact part.

In the semiconductor device, the reinforcer may include resin. This configuration allows the bonding-reinforcement of circumference of the contact part.

In the semiconductor device, the reinforcer may include flux. This configuration enhances the wettability of a solder material included in the contact part, for example, providing preferable electrical coupling between the contact part and the first wiring pattern.

In the semiconductor device, the reinforcer may include a solder material. This configuration can surely provide electrical coupling between the contact part and the first wiring pattern.

In the semiconductor, the reinforcer may be a first reinforcer. The semiconductor device may further comprise a second reinforcer provided to expose a part of the contact part and cover circumference of the second end of the contact part. According to this, both ends of the contact part are covered by the first and second reinforcers with part of the contact part being exposed. Thus, the contact part can be reinforced more effectively.

The above-described semiconductor device is mounted on a circuit board according to another aspect of the present invention.

Electronic equipment according to another aspect of the present invention has the above-described semiconductor device.

A method for manufacturing a semiconductor device according to another aspect of the present invention, comprises: (a) mounting a first semiconductor chip on a first interposer having a first wiring pattern so that the first semiconductor chip is electrically coupled to the first wiring pattern, to form a first package; (b) mounting a second semiconductor chip on a second interposer having a second wiring pattern so that the second semiconductor chip is electrically coupled to the second wiring pattern, to form a second package; (c) disposing the second package so that the second interposer overlaps the first semiconductor chip and the first interposer; and (d) forming from a first material a contact part for electrically coupling the first wiring pattern to the second wiring pattern, and forming a reinforcer from a second material, between the first and second interposers. A thermal expansion coefficient of the first package is larger than a thermal expansion coefficient of the second package. A first end of the contact part is coupled to the first wiring pattern and a second end of the contact part is coupled to the second wiring pattern. In the step (d), the reinforcer is provided to expose a part of the contact part and cover circumference of the first end of the contact part. According to the present invention, the reinforcer is formed to cover the first end of the contact part, coupled to the first wiring patter. The first package having the first wiring pattern has a larger thermal expansion coefficient than the second package, and thus the rate of expansion when heated or contraction when cooled is larger. Therefore, larger stress is applied on the first end of the contact part, coupled to the first wiring patter. In the present invention, however, the contact part can be reinforced by the reinforcer effectively. Moreover, since part of the contact part is exposed through the reinforcer, space for releasing vapor and so on is formed between the first and second packages. This configuration can prevent the separation of the first and second packages due to the remaining of vapor and so on, allowing the improvement of bonding strength between the first and second interposes.

In the method for manufacturing a semiconductor device, the step (b) may further include providing a sealing part on the second interposer to seal the second semiconductor chip. A thermal expansion coefficient of the first interposer may be larger than a thermal expansion coefficient of the sealing part.

The method for manufacturing a semiconductor device, may further comprise prior to the step (d): providing the first material on the second interposer; and providing the second material on the first interposer.

The method for manufacturing a semiconductor device, may further comprise prior to the step (d): providing the second material on the first and second interposers; and providing the first material on the second material on the first or second interposer. In the step (d), the reinforcer may be formed as a first reinforcer from the second material provided on the first interposer, and a second reinforcer may be formed from the second material provided on the second interposer. The second reinforcer exposes a part of the contact part and covers circumference of the second end of the contact part. According to this, both ends of the contact part are covered by the first and second reinforcers with part of the contact part being exposed. Thus, the contact part can be reinforced more effectively.

DETAILED DESCRIPTION

Embodiments of the present invention will be described with reference to the accompanying drawings.

First Embodiment

Figure 1:
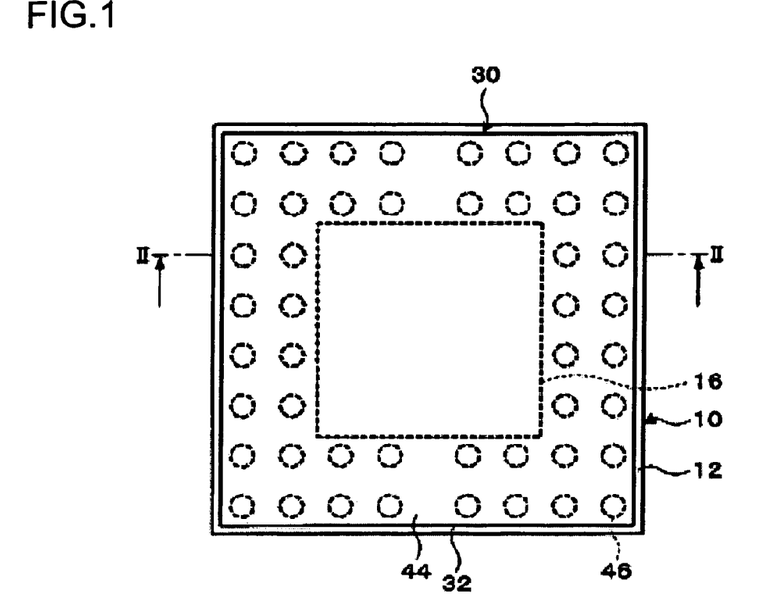
FIG. 1 is a plan view illustrating a semiconductor device according to a first embodiment of the present invention.
Figure 2:
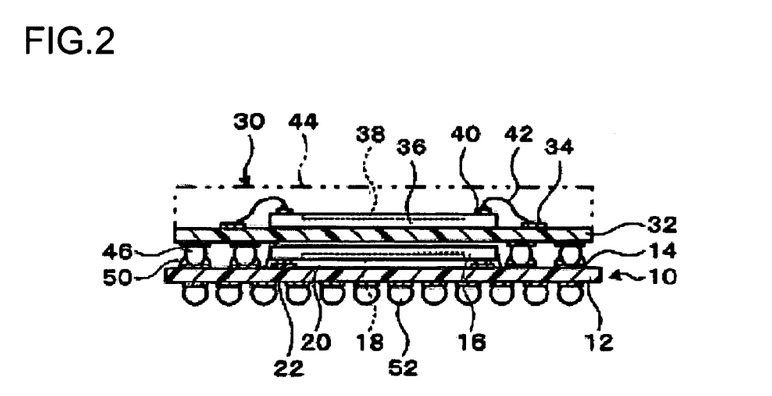
FIG. 2 is a sectional view of the semiconductor device shown in FIG. 1 along the line II—II.
Figure 3:
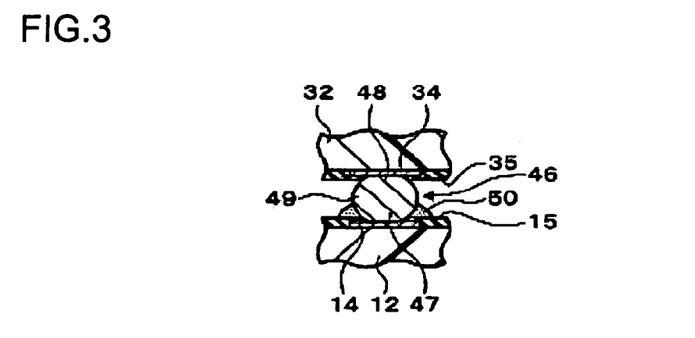
FIG. 3 is a partial enlarged view of FIG. 2.

FIG. 1 is a plan view illustrating a semiconductor device according to a first embodiment of the present invention. FIG. 2 is a sectional view of the semiconductor device shown in FIG. 1 along the line II—II. FIG. 3 is a partial enlarged view of FIG. 2.

The semiconductor device includes a first package 10. The first package 10 has a first interposer 12. The first interposer 12 is a substrate, and may be a plate. The first interposer 12 may be rectangular. The first interposer 12 may be made of a resin such as polyimide resin, or of a mixed material of organic (e.g. resin) and inorganic materials. Alternatively, the first interposer 12 may be a metal or ceramic substrate. The first interposer 12 is provided with a first wiring pattern 14. The first wiring pattern 14 may include a wire for electrically coupling a plurality of points, and a land electrically coupled to another part. The first wiring pattern 14 may be coved by an insulating layer 15, except for a certain part on the pattern (e.g. central part of the land). The first wiring pattern 14 is provided on at least one side of the first interposer 12. The first wiring pattern 14 may be provided on the both sides of the first interposer 12 so that they are electrically coupled via a through hole (not shown). The first interposer 12 may be a multilayer or a build-up substrate.

The first package 10 includes a first semiconductor chip 16. The first semiconductor chip 16 is provided with an integrated circuit 18. The first semiconductor chip 16 is mounted on the first interposer 12. The first semiconductor chip 16 is joined to the first interposer 12 with an adhesive 20. The adhesive 20 may be a resin. The adhesive 20 may be energy setting (e.g., thermosetting, ultraviolet curing). The adhesive 20 may be an electric insulation.

The first semiconductor chip 16 is electrically coupled to the first wiring pattern 14. As shown in FIG. 2, the first semiconductor chip 16 may be bonded face-down to the first interposer 12. In this case, a bump 22 that serves as an electrode of the first semiconductor chip 16 may be placed face to face with the first wiring pattern 14, making the two be electrically coupled to each other. If the adhesive 20 is an anisotropic conductive material (e.g., an anisotropic conductive film or paste), conductive particles provide electrical coupling. If the adhesive 20 is an insulating adhesive, its contraction force may be used for bonding the bump 22 and the first wiring pattern 14 with pressure. Alternatively, the bump 22 and the first wiring pattern 14 may be joined by metallic bonding. As a modification, the first semiconductor chip 16 may be bonded face-up to the first interposer 12 while using a wire for electrical coupling.

The semiconductor device includes a second package 30. The second package 30 includes a second interposer 32. The details of the second interposer 32 are the same as the above description of the first interposer 12. Furthermore, the second interposer 32 may be made of the same material, to the same thickness, with the same thermal expansion coefficient as those of the first interposer 12. Alternatively, the second interposer 32 may be made of a different material and to a different thickness from those of the first interposer 12. The thermal expansion coefficient of the second interposer 32 may be smaller than that of the first interposer 12. Note that the thermal expansion coefficient refers to the rate of contraction when cooled as well as the rate of expansion when heated. The second interposer 32 is provided with a second wiring pattern 34. The details of the second wiring pattern 34 are the same as the above description of the first wiring pattern 14. The second wiring pattern 34 may be covered by an insulating layer 35, except for a certain part on the pattern (e.g. central part of the land).

The second package 30 includes a second semiconductor chip 36. The second semiconductor chip 36 is provided with an integrated circuit 38. The second semiconductor chip 36 is mounted on the second interposer 32 and electrically coupled to the second wiring pattern 34. The second semiconductor chip 36 may be joined to the second interposer 32 with an adhesive (not shown). As shown in FIG. 2, the second semiconductor chip 36 may be bonded face-up to the second interposer 32. In this case, a pad 40 of the second semiconductor chip 36 and the second wiring pattern 34 may be bonded to a wire 42. As a modification, the second semiconductor chip 36 may be bonded face-down to the second interposer 32. In this case, the same as the description of the first semiconductor chip 16 can be applied to provide electrical coupling.

The second package 30 may include a sealing part 44. The sealing part 44 seals the second semiconductor chip 36 and may seal an electrical coupling part (e.g. the wire 42). The sealing part 44 is provided to the second interposer 32. The sealing part 44 may be formed to overlap a plurality of contact parts that will be described later. The sealing part 44 may be made of a resin (e.g. molded resin). The thermal expansion coefficient of the sealing part 44 is smaller than that of the first interposer 12. The thermal expansion coefficient of the sealing part 44 is also smaller than that of the second interposer 32. In order to have a small thermal expansion coefficient, the sealing part 44 may contain silica. Even if the coefficients of thermal expansion of the first interposer 12 and the second interposer 32 are equal as single substances, providing the sealing part 44 makes the thermal expansion coefficient of the second interposer 32 (or second package 30) smaller than that of the first interposer 12 (or first package 10).

The second package 30 is provided to overlap the first package 10. More specifically, the second interposer 32 overlaps the first semiconductor chip 16 and the first interposer 12. The second interposer 32 overlaps the whole area of the first semiconductor chip 16. One second package 30 may be disposed on the first package 10.

The second package 30 (second interposer 32) is stacked on the side of the first package 10 (first interposer 12) on which the first semiconductor chip 16 is mounted. Alternatively, the side of the second package 30 (second interposer 32) on which the second semiconductor chip 36 is mounted may be disposed on the side of the first package 10 (first interposer 12) opposite to the one side on which the first semiconductor chip 16 is mounted.

Provided between the first package 10 (first interposer 12) and the second package 30 (second interposer 32) are a plurality of contact parts 46. Each contact part 46 electrically couples the first wiring pattern 14 and the second wiring pattern 34. For example, part of the first wiring pattern 14 (e.g. land) and part of the second wiring pattern 34 (e.g. land) may be placed face to face with each other with the contact part 46 therebetween. Of the contact part 46, a first end 47 is coupled to the first wiring pattern 14 while a second end 48 is coupled to the second wiring pattern 34. The contact part 46 may be made of either soft solder or hard solder. Here, solder that does not contain lead (hereinafter referred to as lead-free solder) may be used as a soft solder material. As the lead-free solder, an alloy of tin-silver (Sn—Ag), tin-bismuth (Sn—Bi), tin-zinc (Sn—Zn), or tin-copper (Sn—Cu) may be used. Alternatively, at least one of silver, bismuth, zinc, and copper may be added to these alloys. The contact part 46 has an intermediate part 49 whose cross section is the largest. The first end 47 and the second end 48 of the contact part 46 has a smaller cross section than that of the intermediate part 49 of the contact part 46. The contact part 46 may be part of a substantial sphere.

Provided between the first interposer 12 and the second interposer 32 is a reinforcer 50. The reinforcer 50 exposes part of each contact part 46 and covers the first end 47 of each contact part 46. The exposed part of the contact part 46 from the reinforcer 50 may be the second end 48 of the contact part 46 alone, or a portion from the intermediate part 49 to the second end 48 of the contact part 46 (more than half on one side). The reinforcer 50 is provided not to come in contact with the second interposer 32. The reinforcer 50 may cover the entire circumference of the first end 47. More specifically, the reinforcer 50 may cover the entire circumference of edges of the contact interface between the contact part 46 and the first wiring pattern 14. The reinforcer 50 may spread on the insulating layer 15 provided on an end of the land of the first wiring pattern 14.

The reinforcer 50 may be provided for each contact part 46 so that adjacent reinforcers are not in contact with each other. The reinforcer 50 may avoid areas between the adjacent contact parts 46. The first interposer 12 may be exposed from areas between the adjacent contact parts 46. Alternatively, the reinforcer 50 may collectively cover the plural first ends 47 of the plural contact parts 46.

In the present embodiment, the reinforcer 50 includes a resin (e.g. thermosetting resin). The reinforcer 50 may be an adhesive. This bonding-reinforces the periphery of the contact part 46. The reinforcer 50 may also include flux. This enhances the wettability of the solder material of the contact part 46, and thereby providing desirable electrical coupling between the contact part 46 and the first wiring pattern 14. The reinforcer 50 may also include a solder material. The solder material may be either the same as or different from the material of the contact part 46. This ensures electrical coupling between the contact part 46 and the first wiring pattern 14. Alternatively, an underfill flux or underfill paste may be used as the reinforcer 50. The reinforcer 50 may be a mixture of a resin, flux, and solder material. Alternatively, the reinforcer 50 may be a mixture of a resin and flux, or a resin and solder material. Even if the reinforcer 50 includes a solder material (conductive material), the solder material remains on the first wiring pattern 14. Therefore, electrical short-circuit between the adjacent contact parts 46 can be avoided.

The semiconductor device may include a plurality of external terminals 52 (e.g. solder balls). Each of the external terminals 52 is provided on one side of the first interposer 12 opposite to the other side on which the first semiconductor chip 16 is mounted. The external terminal 52 may be provided on a land that is part of the first wiring pattern 14. The external terminal 52 may be made of either soft solder or hard solder. The above-described lead-free solder may be used as a soft solder material.

According to the present embodiment, the reinforcer 50 covers the first end 47, which is coupled to the first wiring pattern 14, of the contact part 46. The first package 10 provided with the first wiring pattern 14 has a larger thermal expansion coefficient than the second package 30, and thus the rate of expansion when heated and the rate of contraction when cooled are larger. As a result, the first end 47 coupled to the first wiring pattern 14 receives a larger stress in the contact part 46. In the present embodiment, however, the contact part 46 is effectively reinforced by the reinforcer 50. Furthermore, since the reinforcer 50 exposes part of the contact part 46, a space for releasing water vapor is formed between the first package 10 and the second package 30. This prevents the separation of the first package 10 and the second package 30 due to remaining water vapor, and thereby increasing bonding strength between the first interposer 12 and the second interposer 32. Since the contact part 46 is not sealed by the reinforcer 50, there is no possibility that volume expansion in re-fusing (e.g. when reflowing the external terminals 52) damages sealed spaces. This also makes it possible to increase bonding strength between the first interposer 12 and the second interposer 32.

Figure 4:
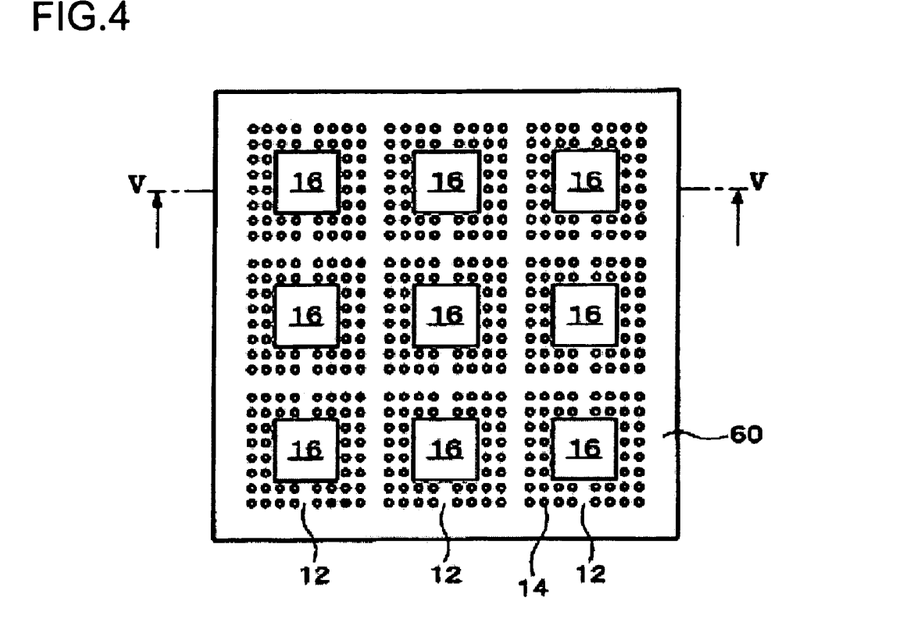
FIG. 4 is a diagram for explaining a method for manufacturing a semiconductor device according to the first embodiment of the present invention.
Figure 5:
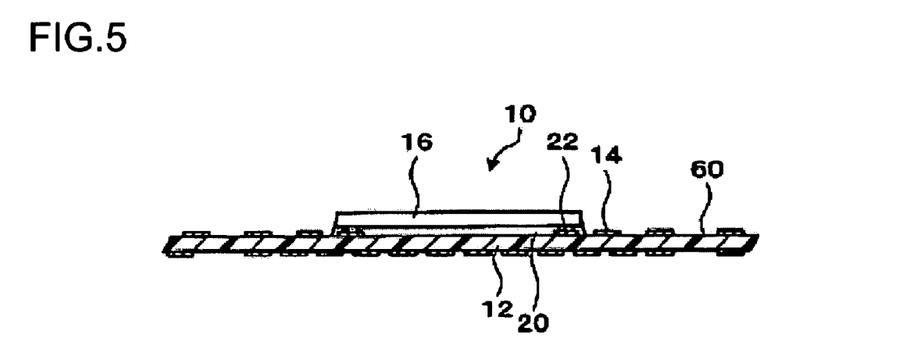
FIG. 5 is a diagram for explaining a method for manufacturing a semiconductor device according to the first embodiment of the present invention.

FIG. 4 is a diagram showing part of a method for manufacturing a semiconductor device according to an embodiment of the present invention. More specifically, FIG. 4 illustrates the assembly of the first package. FIG. 5 is a partial enlarged view along the line V—V in FIG. 4. In the present embodiment, a first interposer 60 is used. The interposer 60 is cut and divided into the plural first interposers 12 shown in FIG. 1 in a later stage. In other words, the first interposer 60 includes an area to be the plural first interposers 12. The first interposer 60 is provided with the plural first wiring patterns 14. As a modification, the first interposer 12 to be included in individual first packages may be used in the assembly.

The first semiconductor chip 16 is mounted on the first interposer 12. In the present embodiment, the first semiconductor chip 16 is mounted on each area to be the plurality of first interposers 12 of the first interposer 60. The first semiconductor chip 16 is joined to the first interposer 12 with the adhesive 20. Also, the first semiconductor chip 16 is electrically coupled to the first wiring pattern 14. In the present embodiment, each of the plurality of first wiring patterns 14 of the first interposer 60 is electrically coupled to the first semiconductor chip 16. The assembling of the first package 10 includes any processing based on the above description of the first package 10. With each first package 10, a characteristic test of the first semiconductor chip 16 is conducted to see whether it is defective or not. In a later stage, the second package 30 is not stacked on any first package 10 deemed as defective here.

Figure 6:
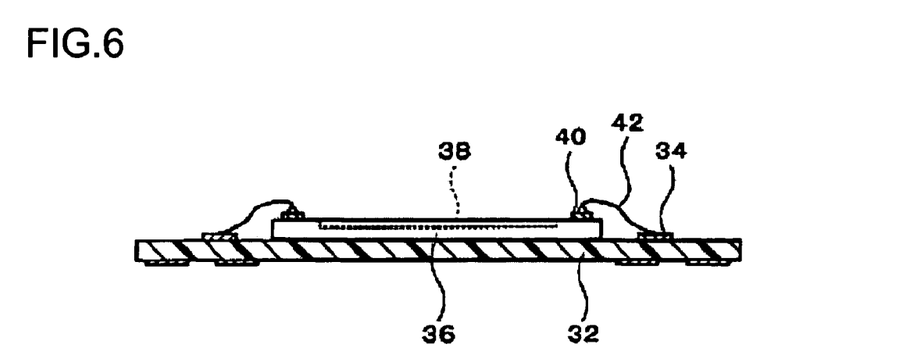
FIG. 6 is a diagram for explaining a method for manufacturing a semiconductor device according to the first embodiment of the present invention.
Figure 7:
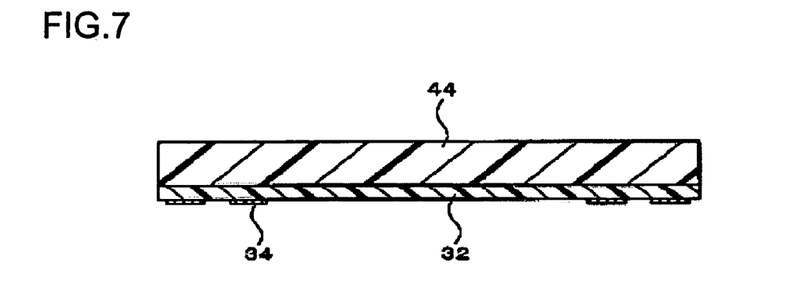
FIG. 7 is a diagram for explaining a method for manufacturing a semiconductor device according to the first embodiment of the present invention.

FIGS. 6 and 7 are diagrams showing part of the method for manufacturing a semiconductor device according to the embodiment of the present invention. More specifically, FIGS. 6 and 7 illustrate the assembly of the second package.

In the present embodiment, as shown in FIG. 6, the second semiconductor chip 36 is mounted on the second interposer 32 provided with the second wiring pattern 34. The second semiconductor chip 36 may be joined to the second interposer 32 with an adhesive (not shown). Also, the second semiconductor chip 36 is electrically coupled to the second wiring pattern 34. The detailed process may be based on the above description of the second package 30. As a modification, a second interposer including an area to be the plural second interposers 32 may be used. The details of this second interposer are the same as the above description of the first interposer 60.

As shown in FIG. 7, the sealing part 44 is provided to the second interposer 32 so as to seal the second semiconductor chip 36. The sealing part 44 may be formed by transfer molding. The detailed process may be based on the above description of the second package 30. With each second package 30, a characteristic test of the second semiconductor chip 36 is conducted to see whether it is defective or not. The characteristic test may be conducted after providing the sealing part 44, or may be conducted before that. In the latter case, the sealing part 44 may not be provided to any second semiconductor chip 36 deemed as defective.

Figure 8:
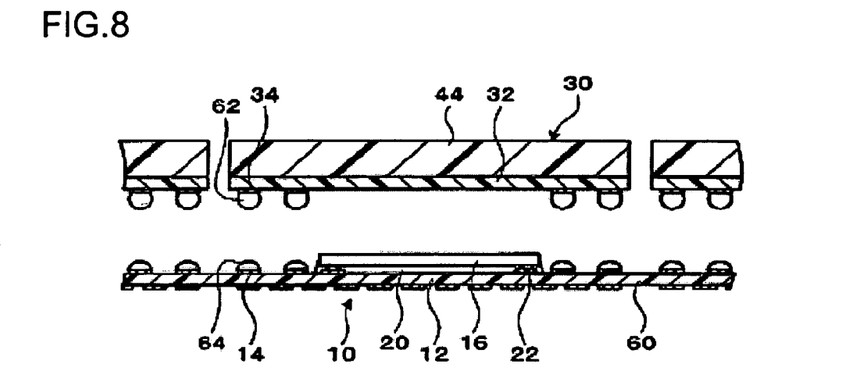
FIG. 8 is a diagram for explaining a method for manufacturing a semiconductor device according to the first embodiment of the present invention.
Figure 9:
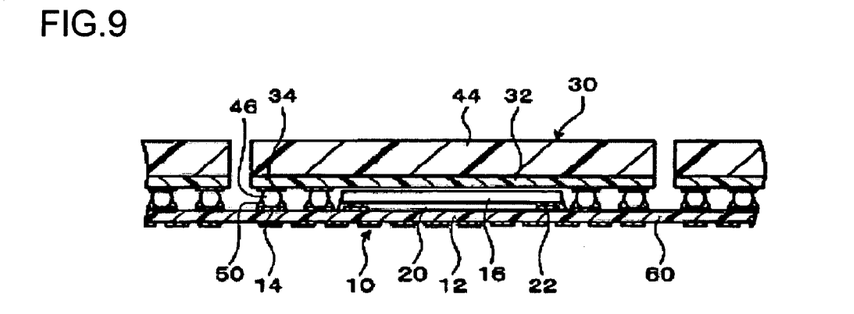
FIG. 9 is a diagram for explaining a method for manufacturing a semiconductor device according to the first embodiment of the present invention.
Figure 10:
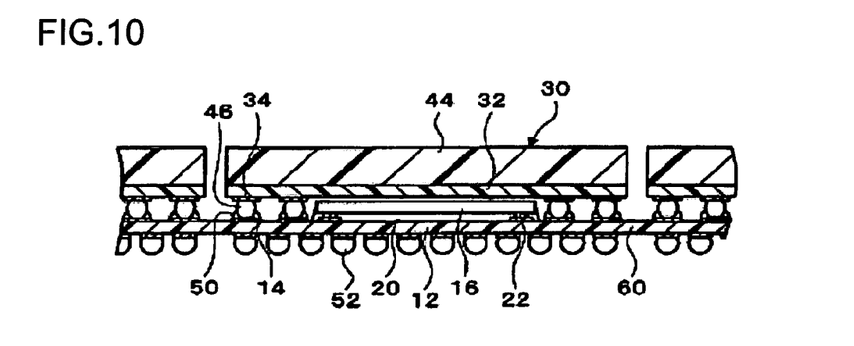
FIG. 10 is a diagram for explaining a method for manufacturing a semiconductor device according to the first embodiment of the present invention.

FIGS. 8 to 10 are diagrams showing the method for manufacturing a semiconductor device according to the embodiment of the present invention. According to the present embodiment, the second package 30 is disposed above the first package 10. The second interposer 32 is stacked on one side of the first interposer 12 on which the first semiconductor chip 16 is mounted. The second package 30 is placed so that the second interposer 32 overlaps the first semiconductor chip 16 and the first interposer 12. The detailed process may be based on the above-described arrangement of the first package 10 and the second package 30.

Before stacking the first package 10 (first interposer 12) and the second package 30 (second interposer 32), a first material 62 for forming the contact part 46 and a second material 64 for forming the reinforcer 50 are provided between the first interposer 12 and the second interposer 32 (for example, on at least either of the first interposer 12 and the second interposer 32). The first material 62 is provided to the second interposer 32 side, while the second material 64 is provided to the first interposer 12 side. The first material 62 may be ball-shaped (solid). The first material 62 may be soft solder or hard solder. The above-described lead-free solder may be used as a soft solder material. The first material 62 may be a solder ball. The second material 64 may be a paste. The second material 64 may be a resin paste, and may further include at least either flux or solder. Any details may be based on the above description of the reinforcer 50. The second material 64 may be placed face to face with the first material 62. Here, part of the second material 64 may be united with the first material 62, forming the contact part 46.

The first material 62 may be provided to the second interposer 32. More specifically, the first material 62 may be provided to the second wiring pattern 34. The first material 62 may be mounted on each of a plurality of lands of the second wiring pattern 34, for example. The second material 64 may be provided to the first interposer 12 so as to be placed face to face with the first material 62. The second material 64 may be provided to each of a plurality of lands of the first wiring pattern 14, or to an area including more than one land, for example. Here, printing (e.g. screen printing), transferring with a pin, application with a dispenser, droplet discharge (e.g. ink jetting), and other methods are applicable for providing the second material 64.

As a modification, the second material 64 may be adhered to the first material 62 in advance, and they may be provided to either of the first interposer 12 or the second interposer 32 (e.g. first interposer 12).

Here, the first interposer 60 including areas to be the plurality of first interposers 12 may be used, and the second package 30 may be stacked in each area to be the first interposer 12. Note that the second package 30 is not stacked on any first package 10 deemed as defective. This prevents the second package 30 (second semiconductor chip 36) from being wasted.

Referring to FIG. 9, heat processing (e.g. reflow processing) is conducted to melt the first and second materials 62, 64, making the contact part 46 from the first material 62 and the reinforcer 50 from the second material 64. The contact part 46 electrically couples the first package 10 and the second package 30. More specifically, the contact part 46 electrically couples the first wiring pattern 14 and the second wiring pattern 34 between the first interposer 12 and the second interposer 32. The reinforcer 50 may be provided so as to cover the first end 47 of the contact part 46. The reinforcer 50 exposes part of the contact part 46. A gap is provided between the first interposer 12 and the second interposer 32.

Referring next to FIG. 10, the plurality of external terminals 52 may be provided on one side of the first interposer 12 opposite to the other side on which the first semiconductor chip 16 is mounted. The external terminals 52 are ball-shaped like the first material 62, and may include the same material as the first material 62. If the above-described first interposer 60 is used, it is cut and divided into the plural first interposers 12.

The present embodiment provides the semiconductor device through the above-described process. This process includes what is based on the above-described structure of the semiconductor device.

Second Embodiment

Figure 11:
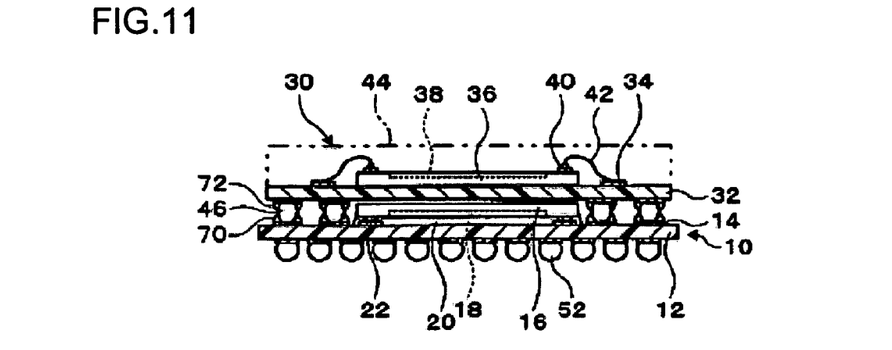
FIG. 11 is a diagram for explaining a semiconductor device according to a second embodiment of the present invention.

FIG. 11 is a sectional view illustrating a semiconductor device according to a second embodiment of the present invention. In the present embodiment, a semiconductor device has a first reinforcer 70 and a second reinforcer 72.

The first and second reinforcers 70 and 72 are provided between the first and second interposers 12 and 32. The first and second reinforcers 70 and 72 are provided with part of the contact part 46 being exposed. The description of exposed part of the contact part 46 is as above.

The first reinforcer 70 covers a first end of the contact part 46, coupled to the first wiring pattern 14. The details of the first reinforcer 70 are the same as the above description of the reinforcer 50.

The second reinforcer 72 covers a second end of the contact part 46, coupled to the second wiring pattern 34. The second reinforcer 72 is provided while avoiding the first interposer 12 (not in contact with the first interposer 12). The second reinforcer 72 may cover the entire circumference of the second end coupled to the second wiring pattern 34. Specifically, the second reinforcer 72 may cover the entire circumference of ends of the contact interface between the contact part 46 and the second wiring pattern 34. The second reinforcer 72 may spread over an insulating layer disposed on an end of a land of the second wiring pattern 34.

The second reinforcer 72 may be provided for each contact part 46 so that adjacent reinforcers are not in contact with each other. The second reinforcer 72 may avoid areas between the adjacent contact parts 46. The second interposer 32 may be exposed through areas between the adjacent contact parts 46. Alternatively, the second reinforcer 72 may be provided so as to collectively cover plural second ends of the plural contact parts 46.

The details of the material of the first reinforcer 72 are the same as the above description of the reinforcer 50. The second reinforcer 72 may be formed of the same material as the first reinforcer 70, or may be formed of a different material. Other details of this configuration include what is based on the first embodiment.

In the present embodiment, both ends of the contact part 46 are covered by the first and second reinforcers 70 and 72 while part of the contact part 46 is exposed. Thus, the contact part 46 can be reinforced more effectively in addition to the effectiveness by the above embodiment.

Figure 12:
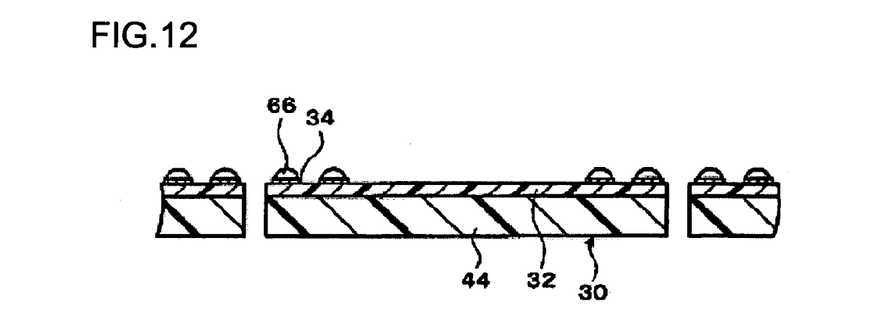
FIG. 12 is a diagram for explaining a method for manufacturing a semiconductor device according to the second embodiment of the present invention.
Figure 13:
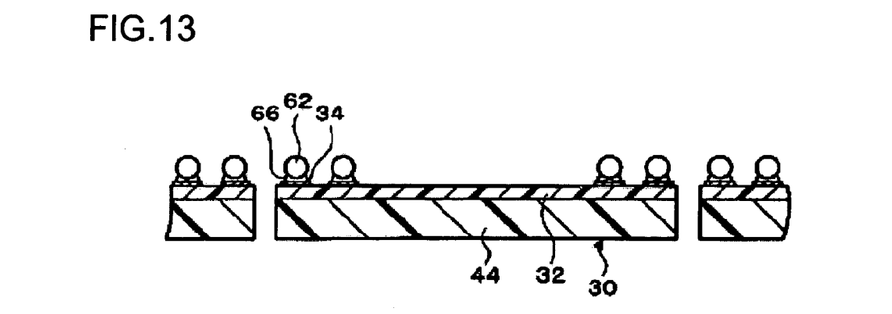
FIG. 13 is a diagram for explaining a method for manufacturing a semiconductor device according to the second embodiment of the present invention.
Figure 14:
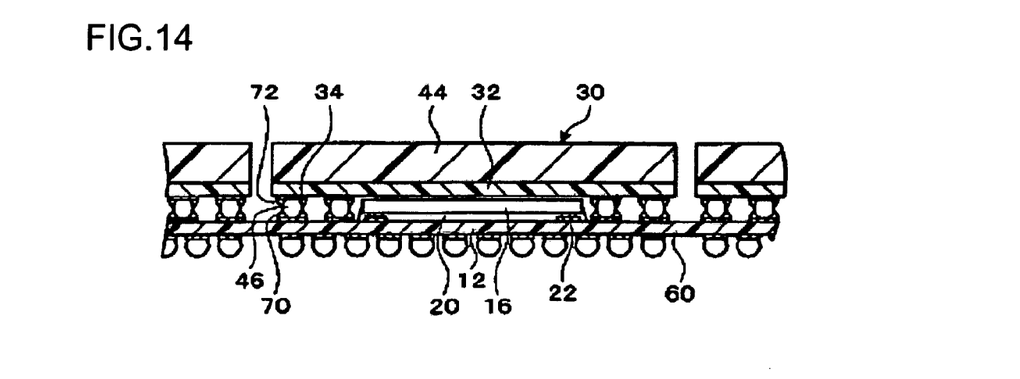
FIG. 14 is a diagram for explaining a method for manufacturing a semiconductor device according to the second embodiment of the present invention.

FIGS. 12 to 14 are diagrams explaining a method for manufacturing a semiconductor device according to the present embodiment. Prior to stacking the first and second packages 10 and 30 (first and second interposers 12 and 32), the first material 62 for forming the contact part 46 and a second material 66 for forming the first and second reinforcers 70 and 72 are provided between the first and second interposers 12 and 32 (for example, on at least either the first or second interposer 12 or 32). The second material 66 is provided so as to be in contact with each of the first and second interposers 12 and 32 (first and second wiring patterns 14 and 34). The first material 62 is provided so as to be in contact with the second material 66 on the first or second interposer 12 or 32. The second material 66 may not be in contact with the first interposer 12. The second material 66 may not be in contact with the second interposer 32. The details of the first material 62 are as above. The details of the second material 66 are the same as the above description of the second material 64.

The second material 66 may be provided on the second interposer 32, while the first material 62 may be provided on the second material 66 on the second interposer 32. In this case, the second material 66 is provided on the first interposer 12 (refer to FIG. 12). Thereafter, the second package 30 is stacked on a region to be the first interposer 12, and then heating treatment (for example, reflow processing) is implemented for fusing the first and second materials 62 and 66. Alternatively, after the second interposer 32 is heated to fuse the first and second materials 62 and 66, the first and second interposers 12 and 32 may be stacked and then be heated again. Thus, the contact part 46 is formed from the first material 62 while the first and second reinforcers 70 and 72 are formed from the second material 66.

As a modification, the second material 66 may be adhered to (the whole surface of the first material 62 in advance, and then the materials 62 and 66 may be provided on either the first or second interposer 12 or 32 (on the second interposer 32, for example).

Other details of this process include what is based on the description of structure of the above semiconductor device.

Figure 15:
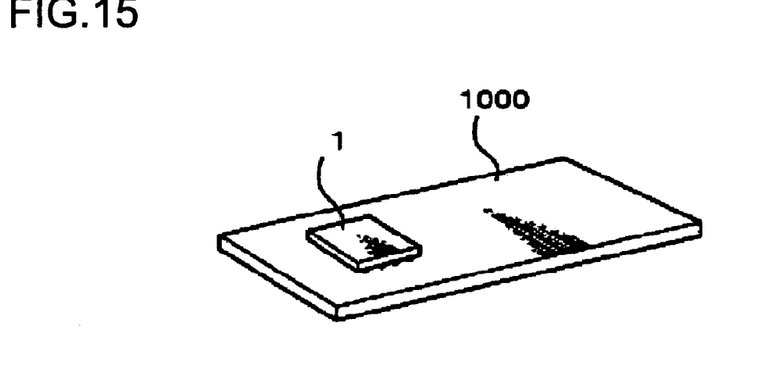
FIG. 15 is a diagram showing a circuit board provided with the semiconductor device according to the embodiments.
Figure 16:
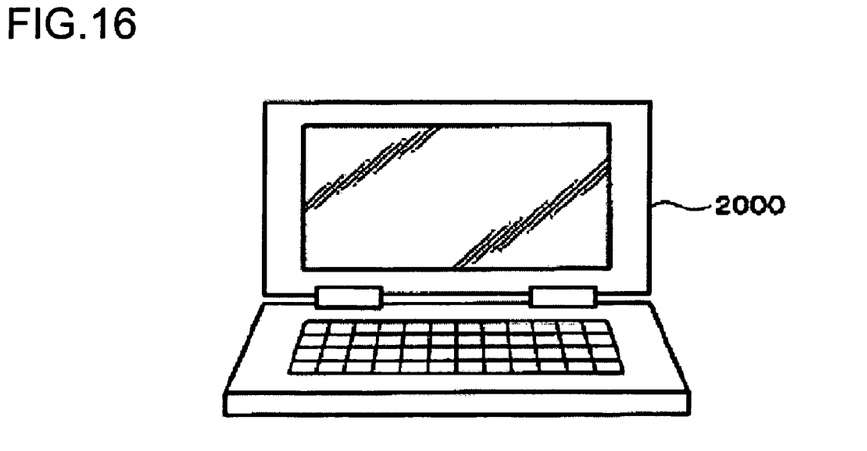
FIG. 16 is a diagram showing electronic equipment that has the semiconductor device according to the embodiments.
Figure 17:
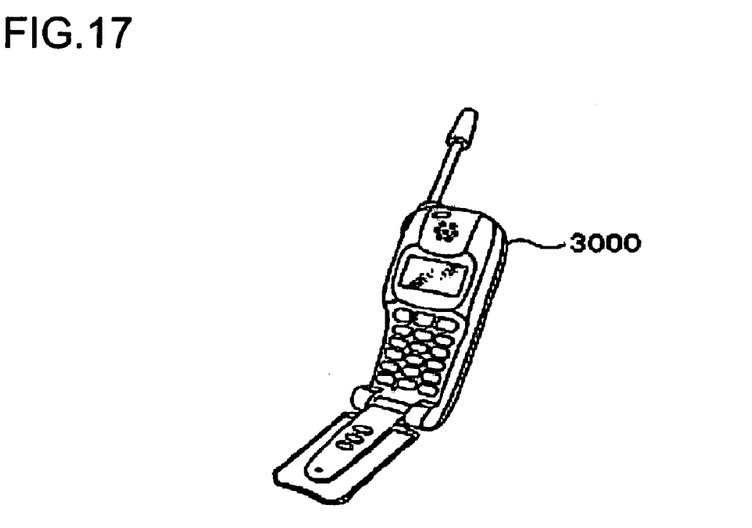
FIG. 17 is a diagram showing electronic equipment that has the semiconductor device according to the embodiments.

FIG. 15 illustrates a circuit board 1000 provided with a semiconductor device 1 that has been described in the above embodiments. As electronic equipment having the semiconductor device, a notebook personal computer 2000 and a cellular phone 3000 are illustrated in FIGS. 16 and 17, respectively.

The present invention is not limited to the above-described embodiments, and various changes and modifications can be made. For example, the invention includes substantially the same structures as those described in the embodiments (e.g., structures involving the same functions, methods, and results, or the same aims and results as those described above). In addition, the invention includes structures obtained by replacing non-essential parts of the structure described in the embodiments. The invention further includes structures that can achieve the same advantageous effects or aims as those described in the embodiments. In addition, the invention includes structures obtained by adding related arts to the structure described in the embodiments.

What is claimed is:

1. A semiconductor device comprising:
    a first package including a first interposer and a first semiconductor chip, the first interposer having a first wiring pattern, the first semiconductor chip being mounted on the first interposer and being electrically coupled to the first wiring pattern;
    a second package including a second interposer and a second semiconductor chip, the second interposer having a second wiring pattern, the second semiconductor chip being mounted on the second interposer and being electrically coupled to the second wiring pattern;
    a contact part electrically coupling the first wiring pattern to the second wiring pattern; and
    a reinforcer, wherein:
    a thermal expansion coefficient of the first package is larger than a thermal expansion coefficient of the second package;
    the second package is disposed so that the second interposer overlaps the first semiconductor chip and the first interposer;
    the contact part is provided between the first and second interposers so that a first end of the contact part is coupled to the first wiring pattern and a second end of the contact part is coupled to the second wiring pattern; and
    the reinforcer is provided to expose a part of the contact part and cover circumference of the first end of the contact part.

2. The semiconductor device according to claim 1, further comprising a sealing part provided on the second interposer to seal the second semiconductor chip, wherein a thermal expansion coefficient of the first interposer is larger than a thermal expansion coefficient of the sealing part.

3. The semiconductor device according to claim 1, wherein:
    the contact part includes an intermediate part having a largest section; and
    the reinforcer is provided to expose the intermediate part of the contact part.

4. The semiconductor device according to claim 1, wherein the reinforcer includes resin.

5. The semiconductor device according to claim 1, wherein the reinforcer includes flux.

6. The semiconductor device according to claim 1, wherein the reinforcer includes a solder material.

7. The semiconductor device according to claim 1, the reinforcer being a first reinforcer, further comprising a second reinforcer provided to expose a part of the contact part and cover circumference of the second end of the contact part.

8. A circuit board comprising the semiconductor device according to claim 1.

9. Electronic equipment comprising the semiconductor device according to claim 1.

10. A method for manufacturing a semiconductor device, comprising:
    (a) mounting a first semiconductor chip on a first interposer having a first wiring pattern so that the first semiconductor chip is electrically coupled to the first wiring pattern, to form a first package;
    (b) mounting a second semiconductor chip on a second interposer having a second wiring pattern so that the second semiconductor chip is electrically coupled to the second wiring pattern, to form a second package;
    (c) disposing the second package so that the second interposer overlaps the first semiconductor chip and the first interposer; and
    (d) forming from a first material a contact part for electrically coupling the first wiring pattern to the second wiring pattern, and forming a reinforcer from a second material, between the first and second interposers, wherein:
    a thermal expansion coefficient of the first package is larger than a thermal expansion coefficient of the second package;
    a first end of the contact part is coupled to the first wiring pattern and a second end of the contact part is coupled to the second wiring pattern; and
    in the step (d), the reinforcer is provided to expose a part of the contact part and cover circumference of the first end of the contact part.

11. The method for manufacturing a semiconductor device according to claim 10, wherein:
    the step (b) further includes providing a sealing part on the second interposer to seal the second semiconductor chip; and
    a thermal expansion coefficient of the first interposer is larger than a thermal expansion coefficient of the sealing part.

12. The method for manufacturing a semiconductor device according to claim 10, further comprising prior to the step (d):
    providing the first material on the second interposer; and
    providing the second material on the first interposer.

13. The method for manufacturing a semiconductor device according to claim 10, further comprising prior to the step (d):
    providing the second material on the first and second interposers; and
    providing the first material on the second material on the first or second interposer, wherein:
    in the step (d), the reinforcer is formed as a first reinforcer from the second material provided on the first interposer; and
    in the step (d), a second reinforcer is formed from the second material provided on the second interposer, the second reinforcer exposing a part of the contact part and covering circumference of the second end of the contact part.

* * * * *